(12) United States Patent
Pan et al.

(10) Patent No.: US 8,929,058 B2
(45) Date of Patent: Jan. 6, 2015

(54) FASTENING DEVICE, HOUSING, AND ELECTRONIC DEVICE

(75) Inventors: Xue-Deng Pan, Shenzhen (CN); Chih-Chieh Huang, New Taipei (TW); Cheng-Yi Chao, New Taipei (TW); Zuo-Dong Li, Shenzhen (CN); Shi-Yong Huang, Shenzhen (CN); Chung-Yuan Chen, New Taipei (TW)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 298 days.

(21) Appl. No.: 13/473,657

(22) Filed: May 17, 2012

(65) Prior Publication Data

US 2013/0003267 A1 Jan. 3, 2013

(30) Foreign Application Priority Data

Jun. 28, 2011 (CN) .......................... 2011 1 0177027

(51) Int. Cl.
*G06F 1/16* (2006.01)
*H04M 1/02* (2006.01)
*H05K 5/00* (2006.01)
*F16B 5/02* (2006.01)
*F16B 35/04* (2006.01)

(52) U.S. Cl.
CPC ............ *H04M 1/026* (2013.01); *H05K 5/0008* (2013.01); *H04M 1/0249* (2013.01); *H04M 1/0277* (2013.01); *F16B 5/02* (2013.01); *F16B 35/045* (2013.01)

USPC ................... 361/679.01; 312/293.3; 411/386

(58) Field of Classification Search
USPC ............ 411/386, 403, 410; 361/679.01, 727; 312/293.3
See application file for complete search history.

(56) References Cited

U.S. PATENT DOCUMENTS

| | | | |
|---|---|---|---|
| 1,087,024 A * | 2/1914 | Lingo | 269/65 |
| 1,394,608 A * | 10/1921 | Davern | 411/390 |
| 1,498,360 A * | 6/1924 | Douglas | 439/672 |
| 4,971,502 A * | 11/1990 | Oh | 411/340 |
| 5,363,276 A * | 11/1994 | Crockett | 361/752 |
| 5,439,339 A * | 8/1995 | Batchelor | 411/407 |
| 5,550,712 A * | 8/1996 | Crockett | 361/752 |
| 5,713,705 A * | 2/1998 | Grunbichler | 411/5 |
| 6,307,742 B1 * | 10/2001 | Diaz et al. | 361/679.31 |
| 6,832,869 B2 * | 12/2004 | Lauchner | 403/204 |
| 7,782,611 B2 * | 8/2010 | Yeh et al. | 361/679.57 |
| 8,116,101 B2 * | 2/2012 | Chang et al. | 361/810 |
| 8,284,550 B2 * | 10/2012 | Wang | 361/679.3 |
| 8,322,801 B2 * | 12/2012 | Yang et al. | 312/223.2 |
| 2004/0070934 A1 * | 4/2004 | Tomioka et al. | 361/687 |
| 2008/0130211 A1 * | 6/2008 | Takuma | 361/681 |
| 2010/0014246 A1 * | 1/2010 | Chen | 361/679.56 |
| 2010/0142128 A1 * | 6/2010 | Takechi | 361/679.01 |
| 2011/0194910 A1 * | 8/2011 | Lin et al. | 411/172 |
| 2011/0222217 A1 * | 9/2011 | Ma | 361/679.01 |
| 2012/0019994 A1 * | 1/2012 | Kuan | 361/679.01 |
| 2012/0074153 A1 * | 3/2012 | Yang et al. | 220/694 |

* cited by examiner

*Primary Examiner* — Lisa Lea Edmonds
(74) *Attorney, Agent, or Firm* — Novak Druce Connolly Bove + Quigg LLP

(57) ABSTRACT

A fastening device includes a head and a shank. The shank has opposite ends, one end of the shank is connected to the head, and the other end of the shank defines an operating part. The operating part is capable of cooperating with a disassembling tool to enable the fastening device to rotate with respect to the longitudinal axis of the shank.

14 Claims, 8 Drawing Sheets

FASTENING DEVICE, HOUSING, AND ELECTRONIC DEVICE

BACKGROUND

1. Technical Field

The present disclosure relates to fastening devices, and particularly to a housing and an electronic device using a fastening device.

2. Description of Related Art

Electronic devices use fasteners such as screws to fasten electronic components on circuit boards or the housing of the electronic device. However, the screw heads are unsightly and take away from the aesthetic of the electronic device. Further, if the screw heads are not tightly or properly fixed to the body they can snag on items of clothing and may come loose.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
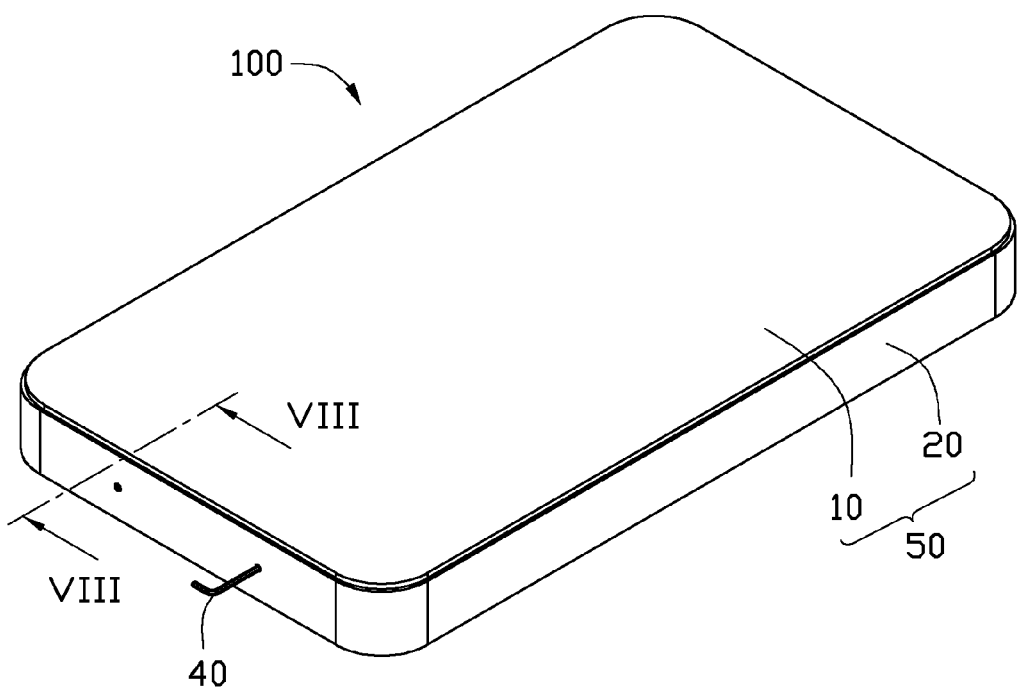
FIG. 1 is an isometric view of an electronic device having a housing.
Figure 2:
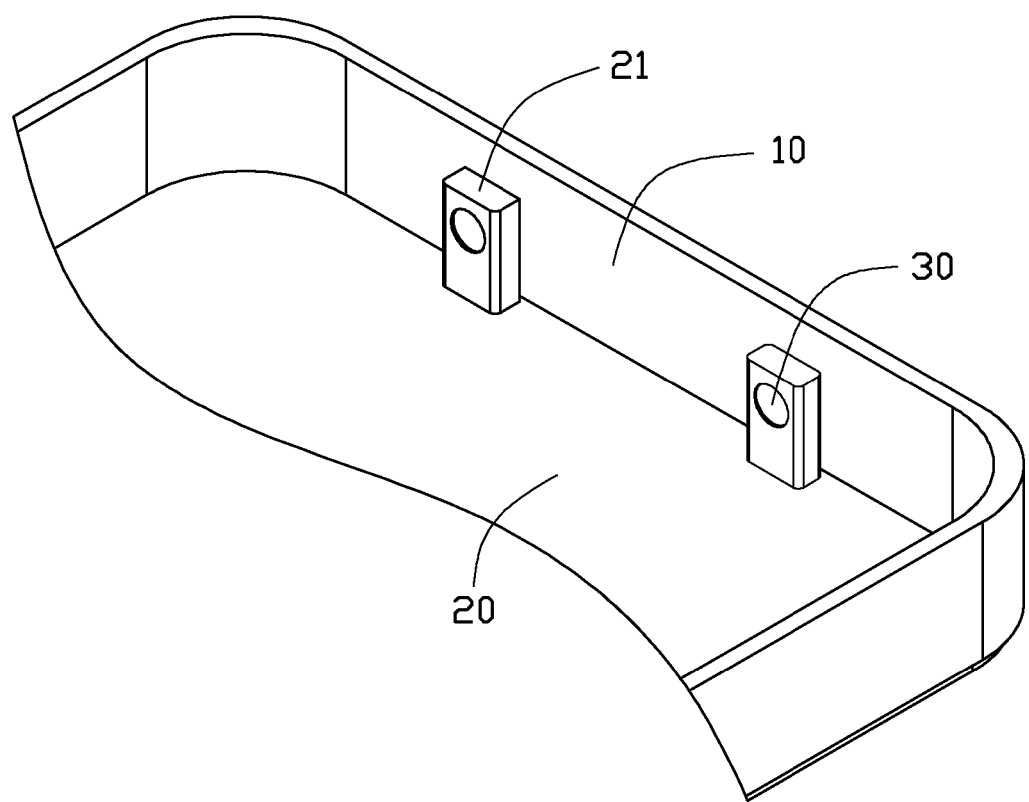
FIG. 2 is an isometric view of the housing in FIG. 1, but viewed from an opposite aspect, the housing has a fastening device.

FIGS. 1-2 show an electronic device 100 in accordance with an embodiment. For example, the electronic device 100 may be a mobile phone, a media player, a notebook computer and so on. The electronic device 100 includes a housing 50 for receiving electronic components (not shown), such as circuit boards, batteries, wires, and so on. The electronic components may create electronic circuits with particular functions of the electronic device 100. The housing 50 includes a first housing 10, a second housing 20, and a plurality of fastening devices 30 for fastening the first housing 10 and the second housing 20 together. A disassembling tool 40 is capable of tightening or releasing the fastening device 30 to make the first housing 10 fix to or detach from the second housing 20.

Figure 3:
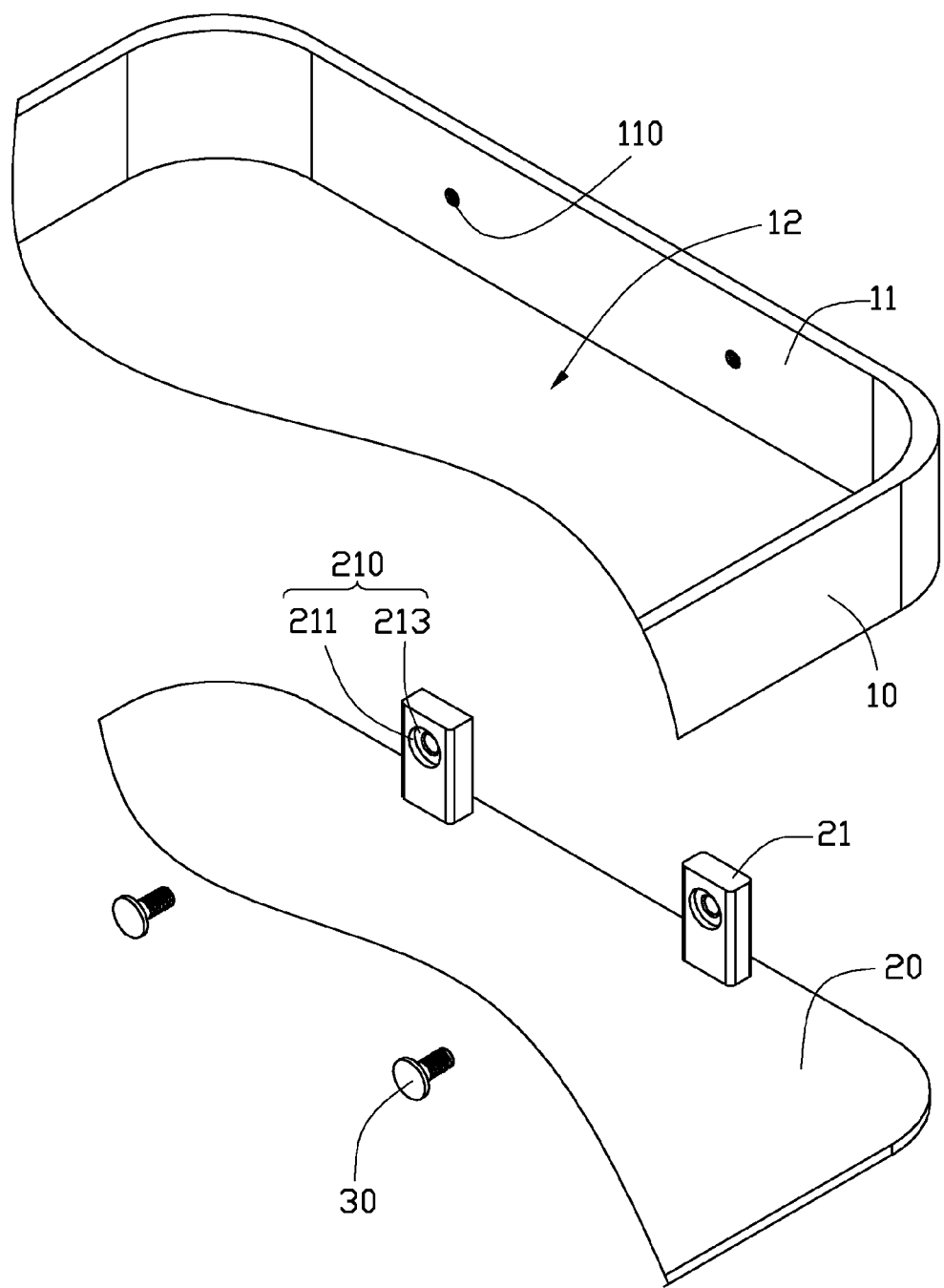
FIG. 3 is an explored view of the housing in FIG. 2.

Referring to FIG. 3, the first housing 10 includes a bottom (not shown), a sidewall 11 protruding from the bottom, and a rectangular opening 12 defined by the sidewall 11 and the bottom. The sidewall 11 defines a plurality of first through holes 110 at interval. For example, the number of the first through holes 110 is two. The first through holes 110 are threaded through holes. Each first through hole 110 has a small diameter, such as 0.9 mm~1.3 mm.

Figure 8:
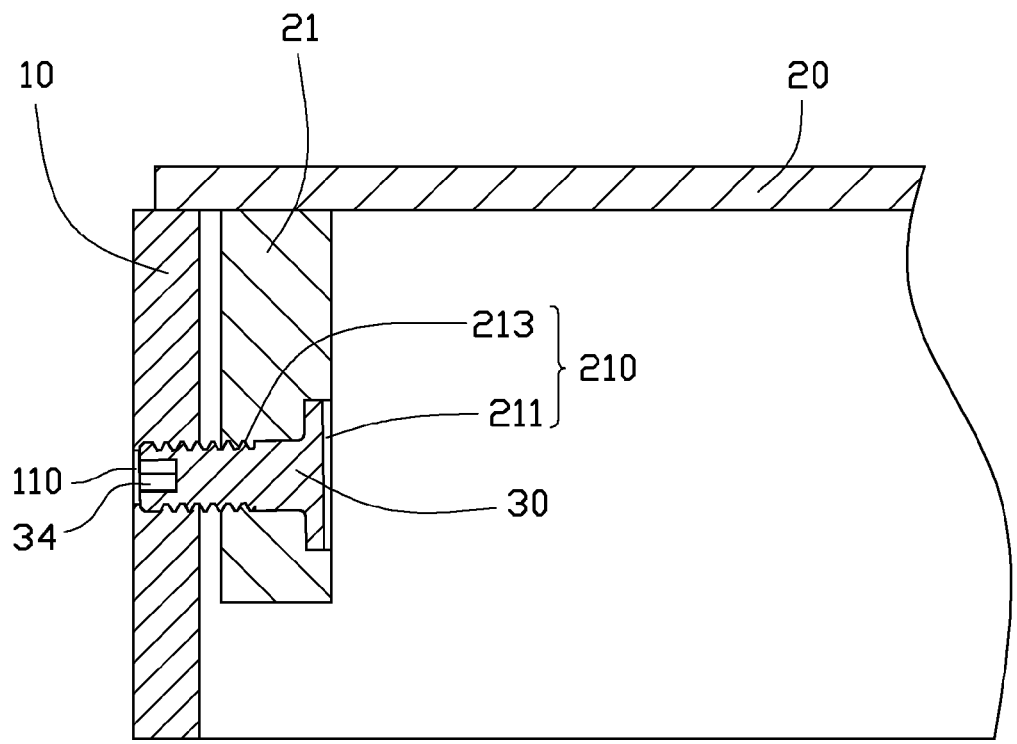
FIG. 8 is a cross-sectional view of the housing in FIG. 1 taken along VIII-VIII.

The second housing 20 covers on the first housing 10 for receiving the electronic components. The second housing 20 is a rectangular board. A plurality of fixing members 21 protrude from a surface of the second housing 20 which faces the first housing 10. The fixing members 21 are adjacent to the edge of the second housing 20. For example, the number of the fixing member 21 is two. Each fixing member 21 is a rectangular block and defines a second through hole 210. The second through hole 210 is a stepped hole, and includes a larger hole 211 and a small hole 213 communicating with the larger hole 211. The small hole 213 is adjacent to the edge of the second housing 20, and the larger hole 211 is away from the edge of the second housing 20. The small hole 213 is a threaded hole, the diameter of the small hole 213 is the same as the diameter of the first through hole 110, but smaller than the diameter of the larger hole 211. When the second housing 20 covers the first housing 10, the second housing 20 seals the opening 12, the fixing members 21 locate inside of the first housing 10 and attach to the sidewall 11, and central axes of the second through hole 210 and the first through hole 110 are arranged in a straight line (see FIG. 8).

Figure 4:
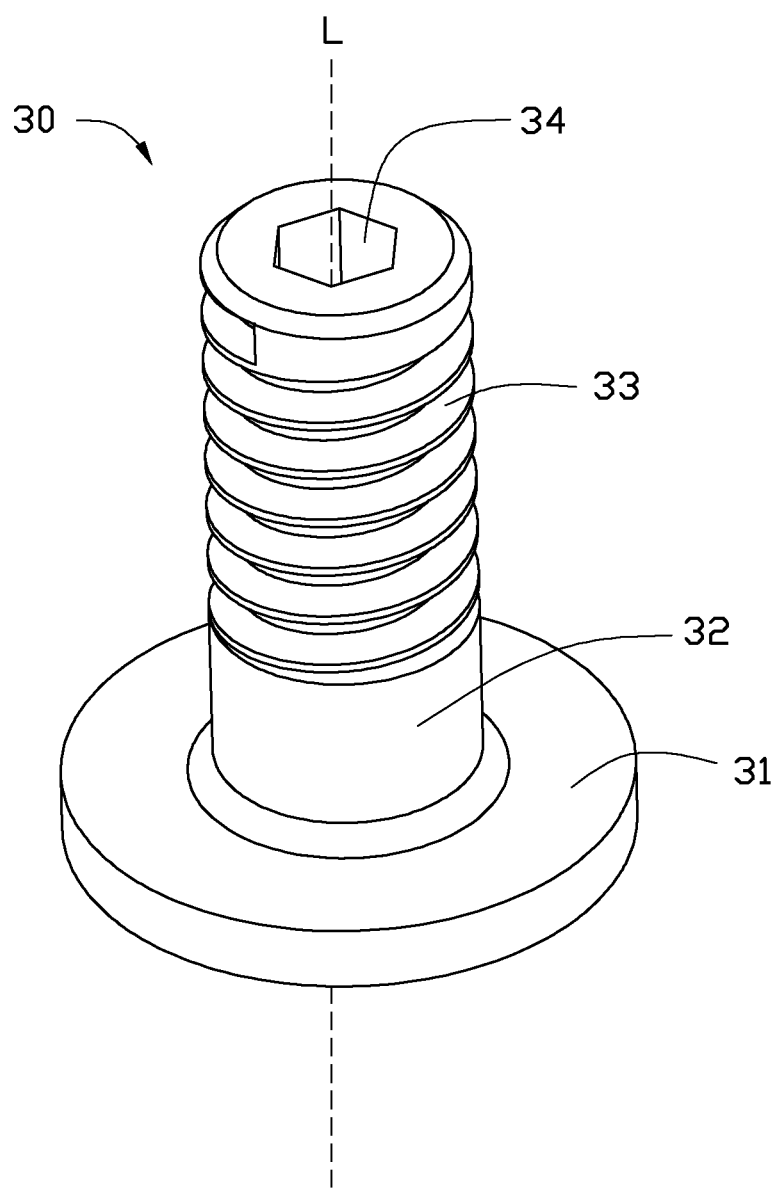
FIG. 4 is an isometric view of the fastening device in FIG. 2.

In the exemplary embodiment, the number of the fastening devices 30 is two. Each fastening device 30 is inserted into one second through hole 210 and one first through hole 110 in order, and engaged in the first housing 10 and the second housing 20. As a result, the first housing 10 and the second housing 20 are fixed together. Each fastening device 30 includes a head 31, a shank 32 connected to the head 31, and a screw thread 33 wrapped around the shank 32 (FIG. 4). The length of screw thread 32 taken along the longitudinal axis L of the shank 32 is the same as or shorter than the sum of the length of the first through hole 110 and the small hole 213. The head 31 is disc-shaped. The shank 32 is columnar. The cross-section of the head 31 is bigger than the cross-section of the shank 32. One end of the shank 32 is connected to the head 31. An operating part 34 is placed on the other end of the shank 32 which matches the disassembling tool 40. The operating part 34 may be a polygon blind hole running along the longitudinal axis L of the shank 32, for example a hexagon socket (see FIG. 4). Accordingly, the disassembling tool 40 may be a screwdriver with polygon bit. It is understood that, the operating part 34 can also be a slot screw socket or a cross-recess socket (not shown). Accordingly, the disassembling tool 40 may be a screwdriver a flat blade or cross blade.

Figure 5:
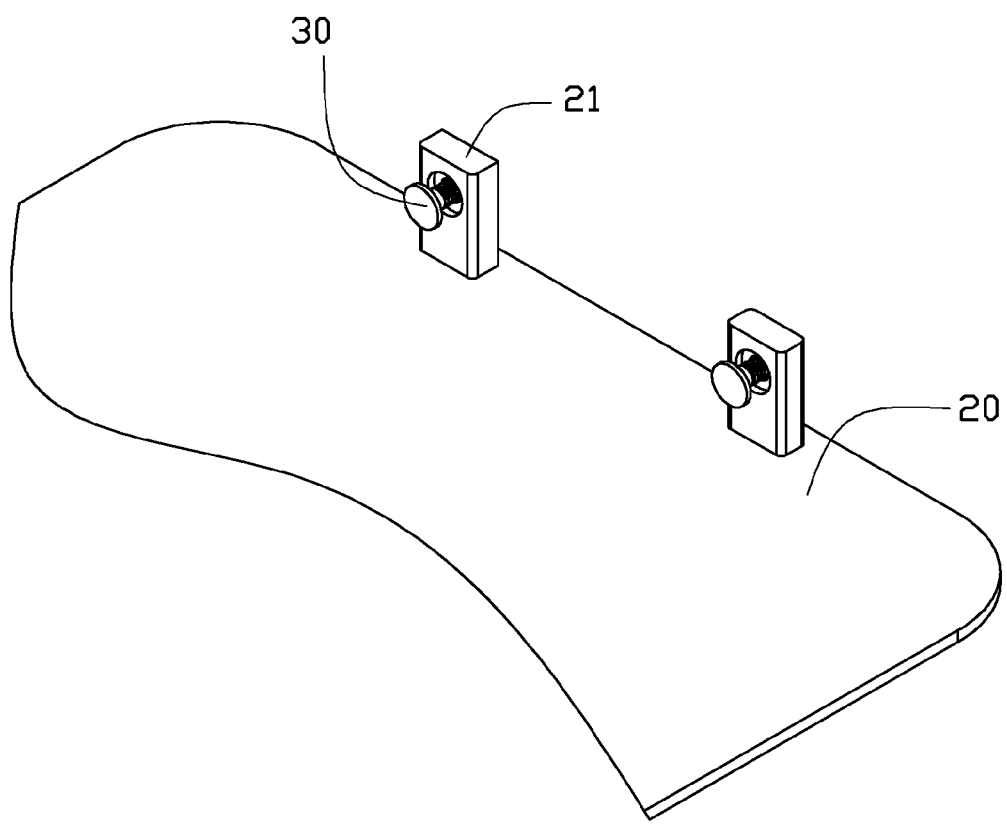
FIG. 5-7 show states of assembling the housing in FIG. 2.
Figure 6:
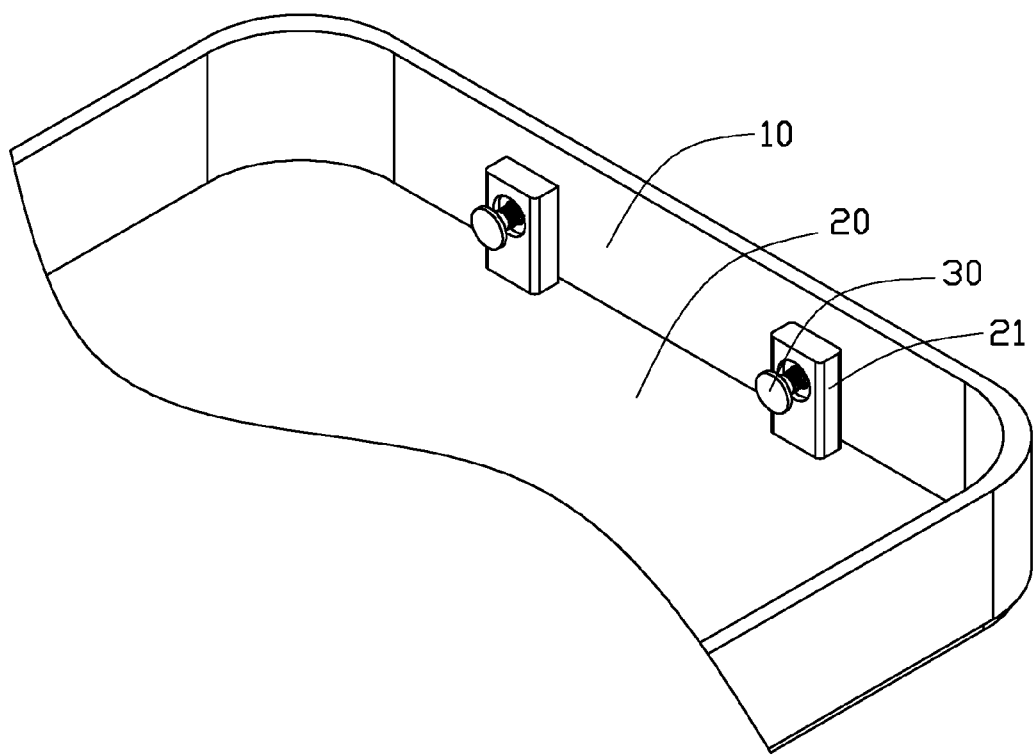
Figure 7:
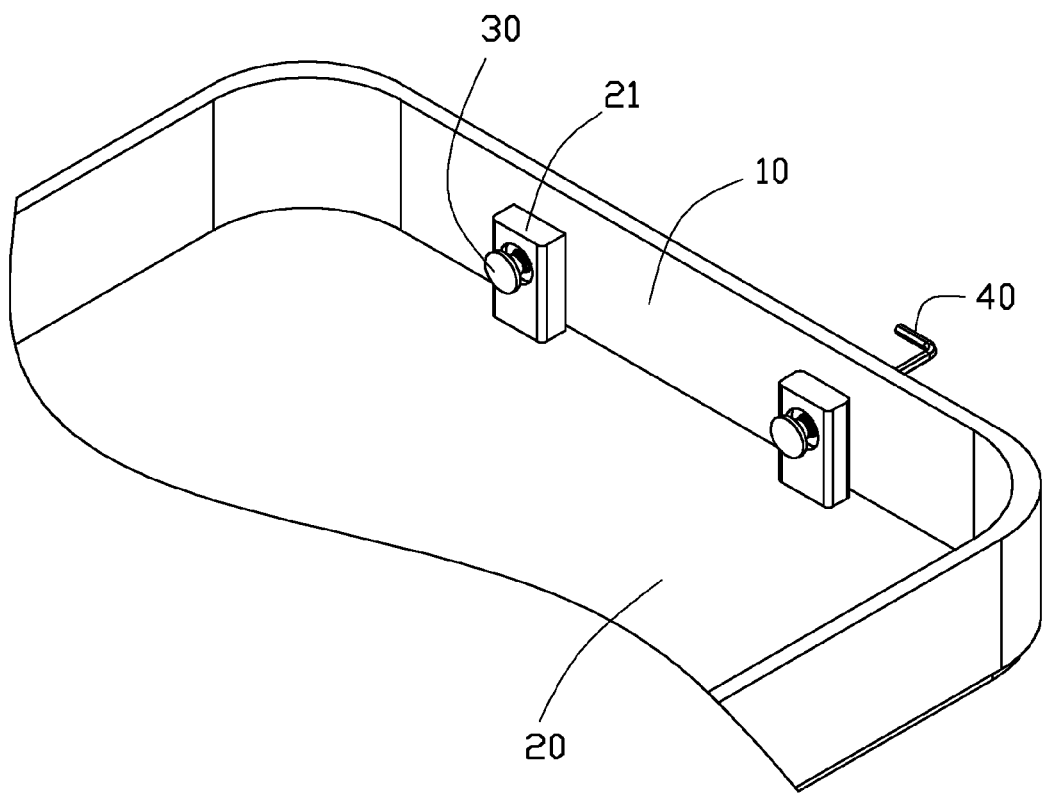

FIGS. 5-7 show how to assemble the first housing 10 and the second housing 20 together by the fastening device 30. Firstly, the fastening devices 30 are approximately screwed into the second through holes 210. For example, the shanks 32 are inserted into larger holes 211, and then screwed in the small holes 213. Secondly, the second housing 20 covers the first housing 10. At this time, the second housing 20 seals the opening 12, the fixing members 21 locate inside of the first housing 10 and attach to the sidewall 11, the small holes 213 are corresponding to the first through holes 110. Thirdly, the disassembling tool 40 is inserted into one of the first through holes 110, and then further inserted into the corresponding operating part 34. Lastly, the disassembling tool 40 is turned to tighten the fastening device 30 until the screw thread 33 is completely screwed into small hole 213 and the first through hole 110, and the head 31 is placed in the larger hole 211 (see FIG. 8). When all the fastening devices 30 are tightened, the first housing 10 and the second housing 20 have been assembled.

As described above, the first through holes 110 are very small, the users who use the electronic device 100 cannot discover the fastening device 30 through the first through holes 110. Therefore, the users cannot disassemble the first housing 10 and the second housing 20 to unfasten the electronic components inside. So the risk of damaging the electronic device 100 is reduced.

Even though relevant information and the advantages of the present embodiments have been set forth in the foregoing description, together with details of the functions of the present embodiments, the disclosure is illustrative only; and changes may be made in detail, especially in the matters of shape, size, and arrangement of parts within the principles of the present embodiments to the full extent indicated by the broad general meaning of the terms in which the appended claims are expressed.

What is claimed is:

1. A housing comprising:
   a first housing defining at least one first through hole,
   a second housing covering the first housing, the second housing having at least one fixing member, the at least one fixing member defining at least one second through hole, whereby when the second housing covers the first housing, a space inside the first and second housings is generally inaccessible from outside the first and second housings except via the first through hole and the second through hole; and
   a fastening device located in the inaccessible space and having a head and a shank connected to the head, the shank having an operating part placed on one end of the shank and away from the head, wherein when the second housing covers the first housing, the at least one fixing member is positioned inside of the first housing, the shank is inserted into the at least one second through hole and the at least one first through hole in order, the operating part is capable of cooperating with a disassembling tool inserted into the through holes from outside the first and second housings to enter the inaccessible space and enable the fastening device to screw in the at least one first through hole.

2. The housing of claim 1, wherein the at least one first through hole is a threaded through hole.

3. The housing of claim 2, wherein the fastening device further comprises a screw thread wrapped around the shank.

4. The housing of claim 3, wherein the at least one second through hole is a threaded through hole, the fastening device can be screwed in the at least one second through hole before the second housing covers the first housing.

5. The housing of claim 3, wherein the at least one second through hole is a step hole, the at least one second through hole includes a larger hole and a small hole, the larger hole is capable of receiving the head, the small hole is a threaded through hole, the shank is screwed into the small hole.

6. The housing of claim 5, wherein the length of the screw thread taken along the longitudinal axis of the shank is the same as or shorter than the sum of the length of the small hole and the at least one first through hole.

7. The housing of claim 1, wherein the operating part is a blind hole defined on the other end of the shank, and runs along the longitudinal axis of the shank.

8. An electronic device comprising:
   a first housing defining at least one first through hole,
   a second housing covering the first housing, the second housing having at least one fixing member, the at least one fixing member defining at least one second through hole, whereby when the second housing covers the first housing, a space inside the first and second housings is generally inaccessible from outside the first and second housings except via the first through hole and the second through hole; and
   a fastening device located in the inaccessible space and having a head and a shank connected to the head, the shank having an operating part placed on one end of the shank and away from the head, wherein when the second housing covers the first housing, the at least one fixing member is positioned inside of the first housing, the shank is inserted into the at least one second through hole and the at least one first through hole in order, the operating part is capable of cooperating with a disassembling tool inserted into the through holes from outside the first and second housings to enter the inaccessible space and enable the fastening device to screw in the first through hole.

9. The electronic device of claim 8, wherein the fastening device further comprises a screw thread wrapped around the shank.

10. The electronic device of claim 9, wherein the at least one second through hole is a threaded through hole, the fastening device can be screwed in the at least one second through hole before the second housing covers the first housing.

11. The electronic device of claim 10, wherein the at least one first through hole is a threaded through hole.

12. The electronic device of claim 10, wherein the at least one second through hole is a step hole, the at least one second through hole includes a larger hole and a small hole, the larger hole is capable of receiving the head, the small hole is a threaded through hole, the shank is screwed into the small hole.

13. The electronic device of claim 12, wherein the length of the screw thread taken along the longitudinal of the shank is the same as or shorter than the sum of the length of the small hole and the at least one first through hole.

14. The electronic device of claim 8, wherein the operating part is a blind hole defined in an end away from the head, and runs along the longitudinal axis of the shank.

* * * * *